(12) United States Patent
Cok

(10) Patent No.: US 7,973,472 B2
(45) Date of Patent: Jul. 5, 2011

(54) DISPLAY DEVICE WITH POLYGONAL CHIPLETS

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 133 days.

(21) Appl. No.: 12/424,060

(22) Filed: Apr. 15, 2009

(65) Prior Publication Data

US 2010/0264816 A1  Oct. 21, 2010

(51) Int. Cl.
*H01J 1/62* (2006.01)
(52) U.S. Cl. .................................. 313/506; 313/504
(58) Field of Classification Search .................. 313/498, 313/505, 506, 509, 511, 512
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,935,687 A | 8/1999 | Davidson et al. | |
| 6,215,172 B1 | 4/2001 | Schoenfeld | |
| 6,384,529 B2 | 5/2002 | Tang | |
| 7,341,887 B2 | 3/2008 | Wong et al. | |
| 7,352,062 B2 | 4/2008 | Joshi et al. | |
| 7,816,856 B2 * | 10/2010 | Cok et al. ...................... | 313/503 |

| | | |
|---|---|---|
| 2002/0160546 A1 | 10/2002 | Nozawa et al. |
| 2004/0032637 A1 | 2/2004 | Imamura |
| 2006/0055864 A1 | 3/2006 | Matsumura et al. |
| 2007/0057263 A1 | 3/2007 | Kahen |

FOREIGN PATENT DOCUMENTS

DE  199 50 839 A1  5/2001

OTHER PUBLICATIONS

A Novel Use of Mems Switches in Driving AMOLED, byYoon, Lee, Yang, and Jang, Digest of Technical Papersofthe Society for Information Display, 2008, 3.4, p. 13.
Chiang, Anne, "Application of Fluidic Self Assembly™ Technology to Flat Panel Displays", IDW '00, Jan. 1, 2000, pp. 195-198.

* cited by examiner

*Primary Examiner* — Vip Patel
(74) *Attorney, Agent, or Firm* — Morgan, Lewis & Bockius LLP

(57) ABSTRACT

A display device includes a substrate having a display area; an adhesion layer formed on the substrate surface; a plurality of chiplets adhered to the substrate and distributed within the display area, each chiplet having one or more connection pads, wherein each chiplet has more than four sides; a plurality of pixels formed over the adhesion layer in the display area, each pixel having a bottom electrode electrically connected to a connection pad of one chiplet, one or more layers of light-emitting material formed over the bottom electrode, and a top electrode formed over the one or more layers of light-emitting material; and a cover located over the top electrode and adhered to the substrate.

21 Claims, 5 Drawing Sheets

DISPLAY DEVICE WITH POLYGONAL CHIPLETS

CROSS REFERENCE TO RELATED APPLICATIONS

Reference is made to commonly-assigned U.S. patent application Ser. Nos. 12/191,478 filed Aug. 14, 2008, entitled OLED Device with Embedded Chip Divine to Dustin Winters, et al.; 12/191,462 filed Aug. 14, 2008, entitled DISPLAY DEVICE WITH CHIPLETS to Ronald S. Cok, et al.; 12/272,043 filed Nov. 17, 2008, entitled DISPLAY DEVICE WITH CHIPLETS AND HYBRID DRIVE to Ronald S. Cok, et al.; 12/372,906 filed Feb. 18, 2009, entitled DISPLAY DEVICE WITH CHIPLET DRIVERS to Ronald S. Cok, et al.; 12/372,132 filed Feb. 17, 2009, entitled CHIPLET DRIVER PAIRS FOR TWO-DIMENSIONAL DISPLAY to Ronald S. Cok, et al. and 12/421,137 filed Apr. 9, 2009, the disclosure of which are incorporated herein.

FIELD OF THE INVENTION

The present invention relates to display devices having a substrate with distributed, independent chiplets to control a pixel array.

BACKGROUND OF THE INVENTION

Flat-panel display devices are widely used in conjunction with computing devices, in portable devices, and for entertainment devices, such as televisions. Such displays typically employ a plurality of pixels distributed over a substrate to display images Each pixel incorporates several, differently colored light-emitting elements commonly referred to as sub-pixels, typically emitting red, green, and blue light to represent each image element. As used herein, pixels and sub-pixels are not distinguished and refer to a single light-emitting element. A variety of flat-panel display technologies are known, for example, plasma displays, liquid crystal displays, and light-emitting diode (LED) displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate; the intersections between the row and column electrodes form the electrodes of a light-emitting diode. External drivers then sequentially supply current to each row (or column) while the orthogonal column (or row) supplies a suitable voltage to illuminate each light-emitting diode in the row (or column). In an active-matrix device, active control elements are formed of thin films of semiconductor material, for example amorphous or poly-crystalline silicon, coated over a flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the luminance of the sub-pixel. Each light-emitting element typically employs an independent control electrode and an electrode electrically connected in common. Control of the light-emitting elements is typically provided through a data signal line, a select signal line, a power connection and a ground connection.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials. In such active-matrix designs, each light-emitting element requires a separate connection to a driving circuit.

Employing an alternative control technique, Matsumura et al describe crystalline silicon substrates used for driving LCD displays in U.S. Patent Publication 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown. A matrix-addressing pixel control technique is taught.

Flexible display devices having a flexible substrate and flexible cover that can bend or roll up are of great interest for the wide variety of applications to which such flexible display devices can be applied. However, it is difficult to achieve a high degree of flexibility with thin film transistors that tend to crack or whose behavior changes under stress. The alternative pixel-control devices disclosed by Matsumura are not readily flexible and can crack under stress.

There is a need, therefore, for display devices having improved flexibility and performance.

SUMMARY OF THE INVENTION

According to the present invention, there is provided a display device, comprising:
 a) a substrate having a display area;
 b) an adhesion layer formed on the substrate surface;
 c) a plurality of chiplets adhered to the substrate and distributed within the display area, each chiplet having one or more connection pads, wherein each chiplet has more than four sides;
 d) a plurality of pixels formed over the adhesion layer in the display area, each pixel having a bottom electrode electrically connected to a connection pad of one chiplet, one or more layers of light-emitting material formed over the bottom electrode, and a top electrode formed over the one or more layers of light-emitting material; and e) a cover located over the top electrode and adhered to the substrate.

ADVANTAGES

The present invention has the advantages of greater flexibility and performance.

Figure 1:
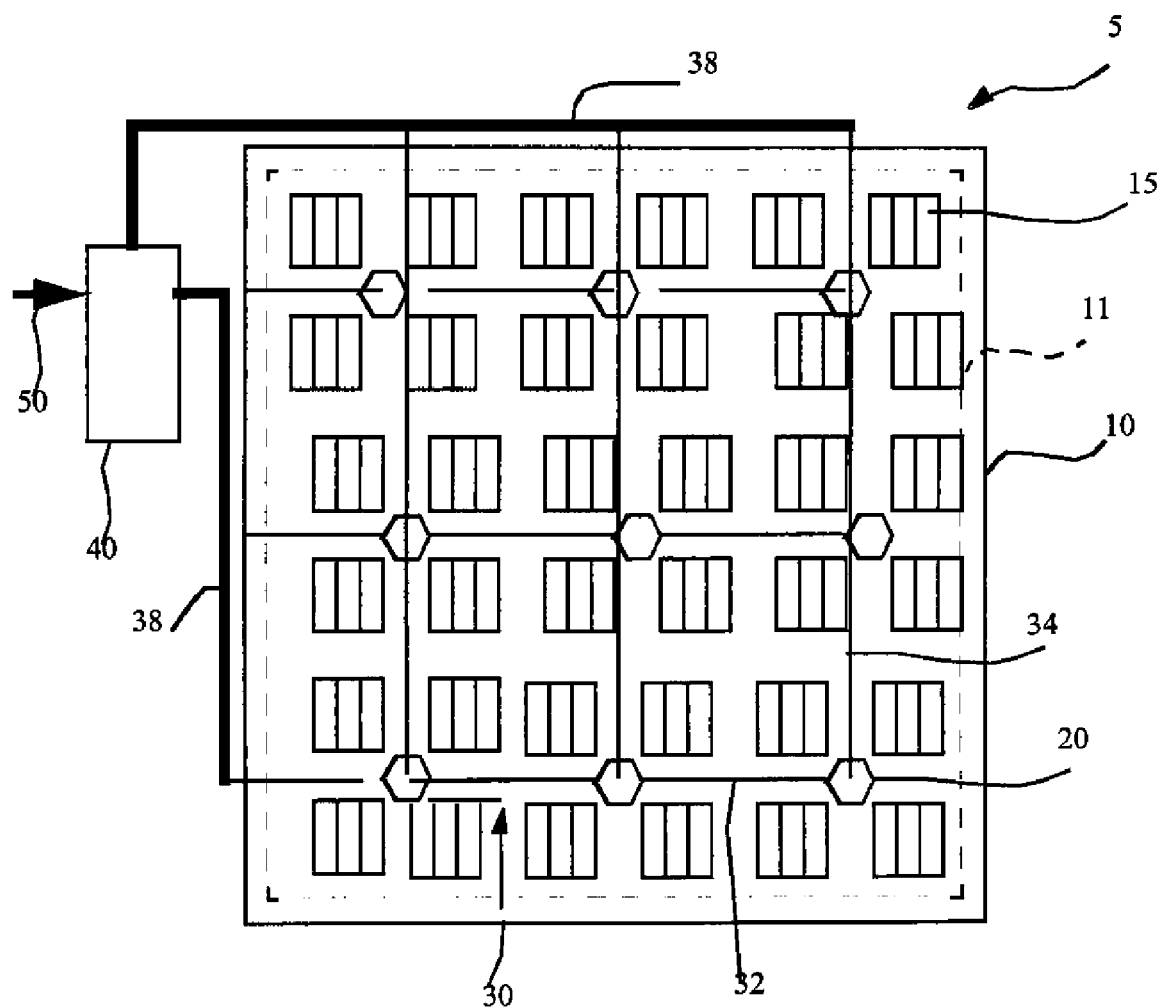
FIG. 1 is a schematic illustrating chiplets located over a substrate in a display area according to an embodiment of the present invention.

Because the various layers and elements in the drawings have greatly different sizes, the drawings are not to scale.

DETAILED DESCRIPTION OF THE INVENTION

Figure 6:
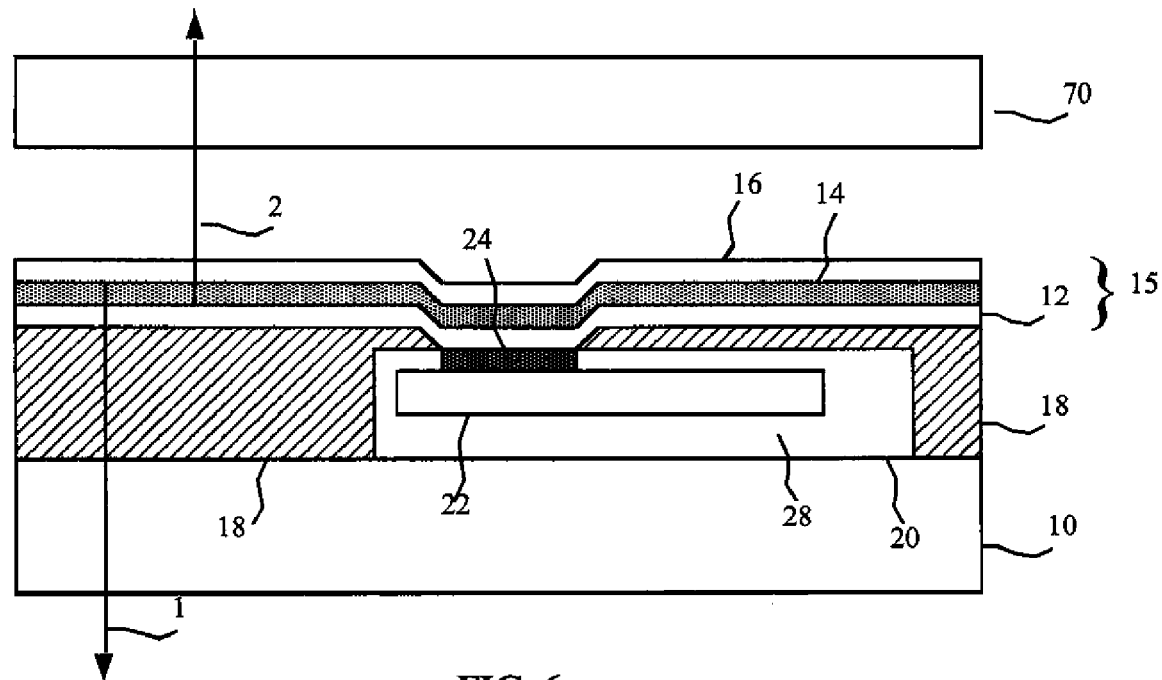
FIG. 6 is a partial cross section of a chiplet and pixel according to an embodiment of the present invention.

Referring to FIG. 1 in a plan view and FIG. 6 in a partial cross section in one embodiment of the present invention, a display device 5 comprises a substrate 10 having a display area 11. An adhesion layer 18 is formed on the substrate 10 surface. A plurality of chiplets 20 are adhered to the substrate 10 and distributed within the display area 11, each chiplet 20 having one or more connection pads 24. The chiplets include pixel-driving circuitry 22 to drive pixels 15 formed over the substrate 10. The adhesion layer 18 can be located between the chiplet 20 and the substrate 10 and also extend around and over at least a portion of the chiplet 20 to secure and protect the chiplet 20. A plurality of pixels 15 are formed over the adhesion layer 18 in the display area 11, each pixel 15 having a patterned bottom electrode 12 electrically connected to a connection pad 24 of one chiplet 20, one or more layers of light-emitting material 14 formed over the bottom electrode 12, and a top electrode 16 formed over the one or more layers of light-emitting material 14. The bottom electrode 12, one or more layers of light-emitting material 14, and the top electrode 16 form a light-emitting diode that is a pixel 15, that can emit light rays 1 through the substrate 10 or that can emit light rays 2 through a cover 70. A cover 70 is located over the top electrode 16 and adhered to the substrate 10. Each chiplet 20 has more than four sides. The pixels 15 may be arranged in a two-dimensional array in the display area 11. Likewise, the chiplets 20 may be distributed in a two-dimensional array over the substrate 10 in the display area 11. The display device 5 can further comprise one or more buss wires 30 interconnecting the chiplets 20. A controller 40 responsive to an image signal 50 can transmit signals through external busses 38 to the buss wire(s) 30 and the chiplets 20 to control the pixels 15 to emit light.

Chiplets 20 are integrated circuits formed on a substrate 28 separate from, and much smaller than, the substrate 10 and located over the substrate 10 in the display area to receive pixel information and drive the pixels 15. The chiplet substrates 28 are typically crystalline and transistors formed on the crystalline substrates have much better electrical performance than thin-film transistors formed on glass or plastic substrates. Multiple pixel-driving circuits 22 can be implemented within a single chiplet 20.

Figure 2:
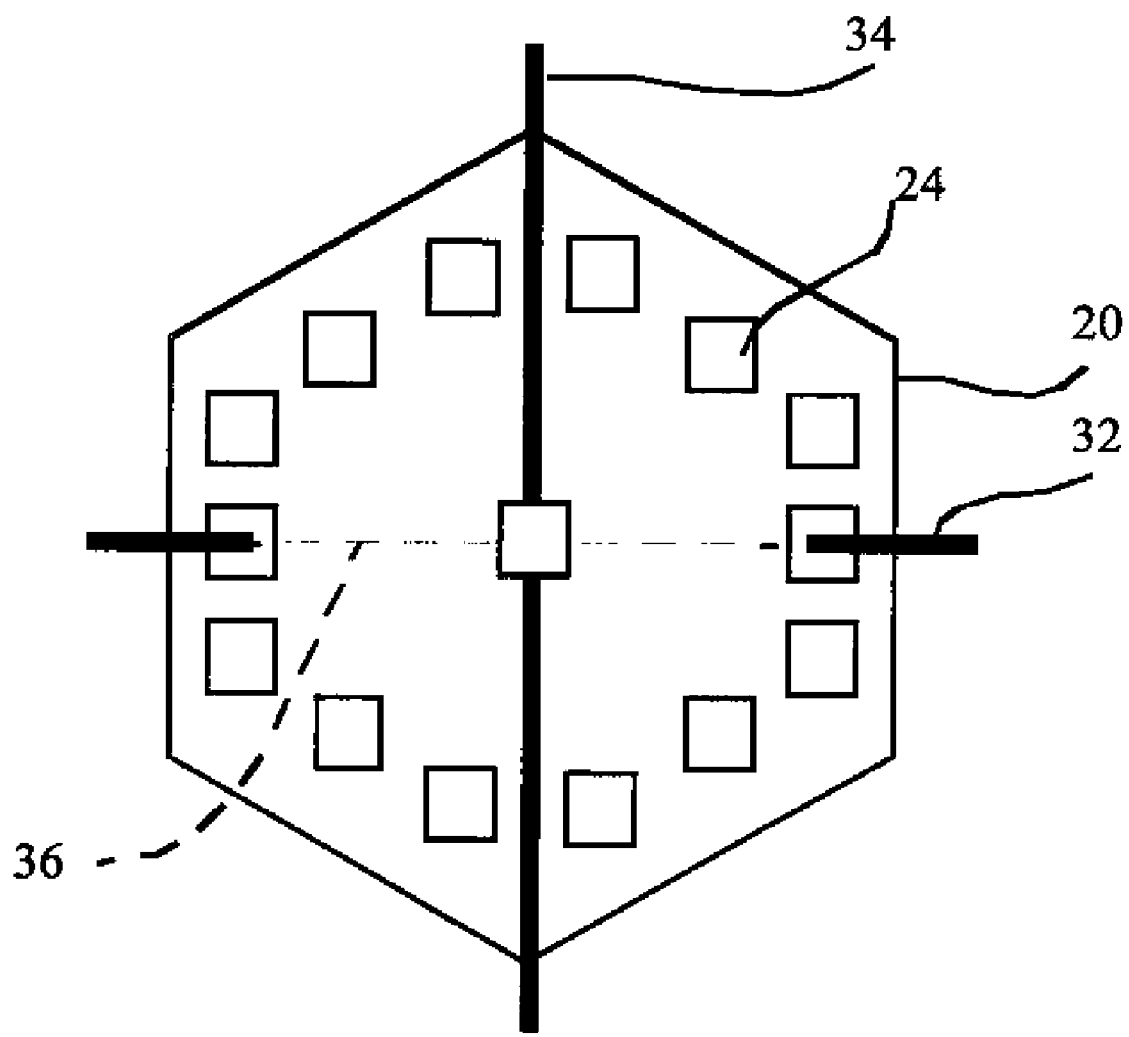
FIG. 2 is a schematic illustrating a chiplet with connection pads according to an embodiment of the present invention.
Figure 3:
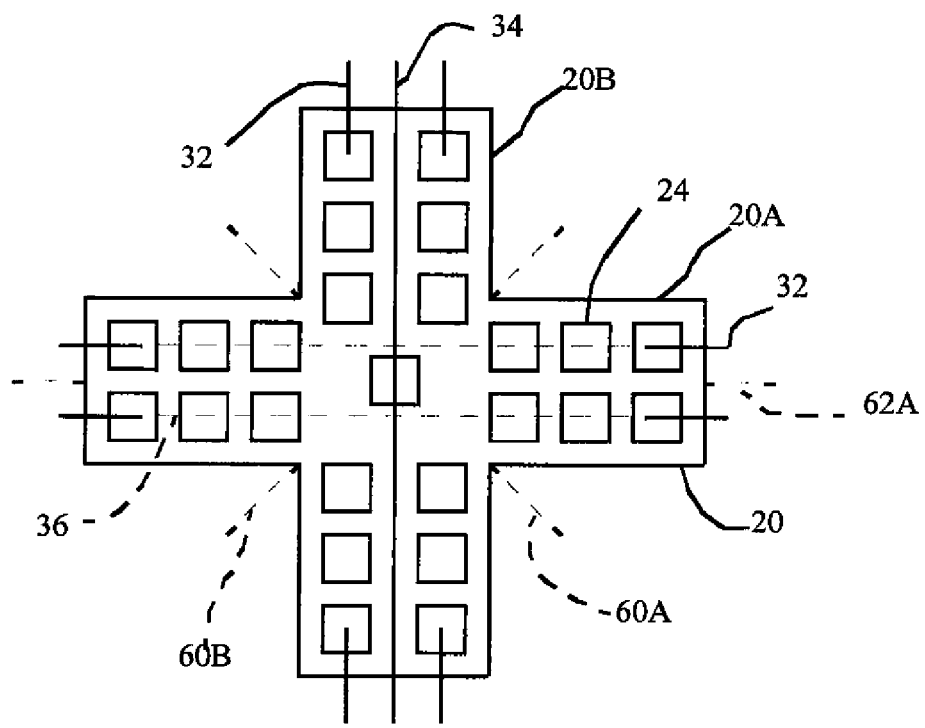
FIG. 3 is a schematic illustrating an alternative chiplet with connection pads according to another embodiment of the present invention.
Figure 4:
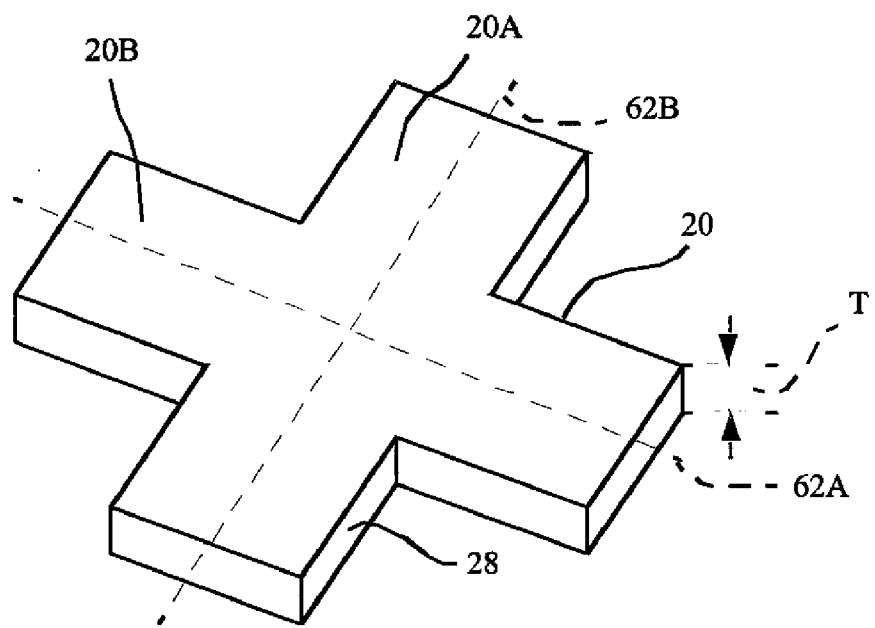
FIG. 4 is a perspective of the chiplet of FIG. 3 according to an embodiment of the present invention.

According to various embodiments of the present invention, the chiplets do not completely cover the display area and can have a polygonal shape that can, but need not be, regular. For example, the chiplets can have a hexagonal or octagonal shape. FIG. 2 illustrates a hexagonal chiplet 20 having connection pads 24. The chiplet shape can have both convex and concave angles in the chiplet perimeter. FIGS. 3 and 4 illustrate a chiplet having a plus ('+') sign shape. In other words, the outline of the chiplet illustrated in FIG. 3 represents the standard arithmetic addition symbol called 'plus'. Alternatively, the chiplet 20 shape could be considered to be an 'x' shape (a plus sign shape rotated by 45 degrees).

Figure 5:
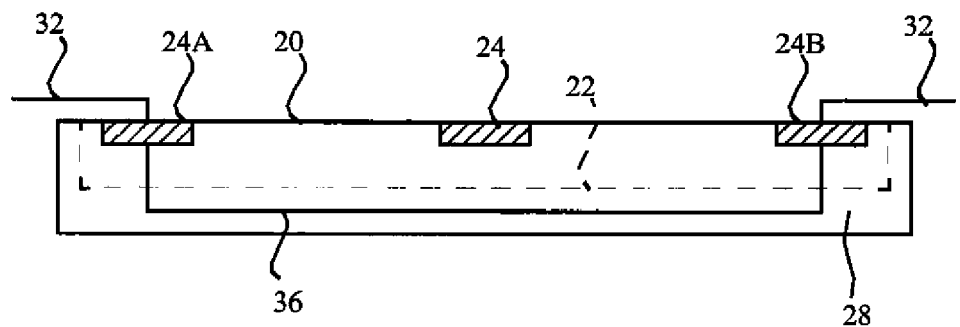
FIG. 5 is a cross section of a chiplet according to an embodiment of the present invention.

Buss wire(s) 30 formed over the substrate 10 in the display area 11 can interconnect chiplets 20 through at least one connection pad 24 in a variety of ways according to various embodiments of the present invention. In one useful embodiment illustrated in FIGS. 2, 3 and 5, a buss wire is divided into buss wire segments 32 that are connected to separate first and second connection pads 24 in a chiplet 20. The connections pads 24 are electrically connected through a chiplet buss 36 to maintain the electrical continuity of the buss wire 30. In another useful embodiment illustrated in FIGS. 1-3, a buss wire segment 34 is connected directly to a connection pad 24 of a plurality of chiplets 20. The buss wire segment 34 in FIG. 2, for example, is formed on a line. The buss wire segment 34 can be routed over the chiplet 20 in a separate wiring layer formed over the substrate 10. Additional buss wire(s) 30 can be employed to make up a larger buss or to form additional busses over the substrate 10 in the display area 11 connected to the chiplets 20 through connection pads 24. The buss wire(s) 30 can form a two-dimensional grid over the substrate 10 in the display area 11.

The relatively thick and large pixel-control chiplets 20 described in the prior art referenced above provide improved electrical performance but have limited flexibility. Moreover, there are limits to the size, both width and length of the chiplets. Furthermore, in a display device having a flexible substrate and cover, chiplets that are too large can experience cracking and the display can fail. Moreover, chiplets with connection pads that are essentially limited to one dimension can be limited in connecting to other device elements such as busses or electrodes. According to various embodiments of the present invention, therefore, chiplets having more than four sides can provide advantages over those disclosed in the prior art.

In cases in which the circuitry 22 within a chiplet 20 is relatively simple and small, the chiplet 20 can be pad-limited, that is its size is limited by the number of pads formed thereon. Because it is desirable to maintain a single wiring layer to reduce costs in a display device employing chiplets, it is likewise useful to locate the connection pads 24 around the periphery of the chiplet 20 so that some buss wire 30 (e.g. buss wire segment 32) can be routed through the chiplet. If other, orthogonally routed buss wire(s) (e.g. buss wire segment 34) pass over the chiplet 20 in the single wiring layer, the buss wire(s) 30 can cross each other, providing improved buss wire routing while maintaining the single, low-cost wiring layer. By providing a chiplet 20 having a more fractal perimeter, additional area is provided for connection pads 24 around the periphery of the chiplets 20 without necessarily increasing the total area of the chiplet and thereby preserving space on the substrate 10 and reducing costs. Furthermore, the length of the chiplet is reduced without necessarily increasing the width of the chiplet, improving the flexibility of the chiplet 20. For example, FIGS. 3 and 4 illustrate a chiplet having an increased number of connection pads 24 and a smaller extent in any one direction. In some embodiments of the present invention, a crossing buss wire 30 (e.g. buss wire segment 34) can electrically connect to a connection pad 24 through a connection pad located in the center of a chiplet, or on a line passing through the center of a chiplet.

In cases in which the circuitry 22 within a chiplet 20 is relatively complex and large, the chiplet 20 can be circuit-limited, that is its size is limited by the circuitry formed therein. As noted, because it is desirable to maintain a single wiring layer to reduce costs in a display device employing chiplets, it is likewise useful to locate the connection pads 24 around the periphery of the chiplet 20 so that some buss wire(s) 30, (e.g. buss wire segment 32) can be routed through the chiplet 20. If other, orthogonally routed buss wire(s) 30 (e.g. buss wire segment 34) pass over the chiplet 20 in the single wiring layer, multiple buss wires 30 can cross each other, providing improved buss wire routing while maintaining the single, low-cost wiring layer. By providing a chiplet 20 having a more nearly circular perimeter, the area of the chiplet 20 devoted to circuitry can be increased relative to the number and area of the connection pads 24. For example, FIG. 2 illustrates a chiplet 20 having an increased area with respect to the number of connection pads 24 without necessarily increasing the extent of the chiplet 20 in any one direction.

It is also useful to employ chiplets having more than four sides to improve the flexibility of a device in which such chiplets are employed. As noted, large, thick, and long chiplets have reduced flexibility. If larger, rectangular chiplets with more complex circuitry or a greater number of connection pads is required, the chiplet can become too long to practically form, remove, or locate on a substrate. Furthermore, the chiplet may be too long to bend readily when the substrate on which the chiplet is located is bent. Hence, if a designer simply increases the length of a rectangular chiplet to accommodate an increased number of connection pads or a more complex circuit, flexibility is reduced. According to the present invention, chiplets having more than four sides can improve the flexibility of devices in which such chiplets are employed. In one embodiment, by employing hexagonal or octagonal chiplets (e.g. the chiplet of FIG. 2), the maximum diameter or extent of the chiplet is reduced. The same is true for chiplets having both concave and convex perimeter angles (e.g. FIGS. 4 and 5). Therefore the amount of bending the chiplet experiences is likewise reduced, improving the flexibility of any devices in which the chiplets are employed.

Figure 7:
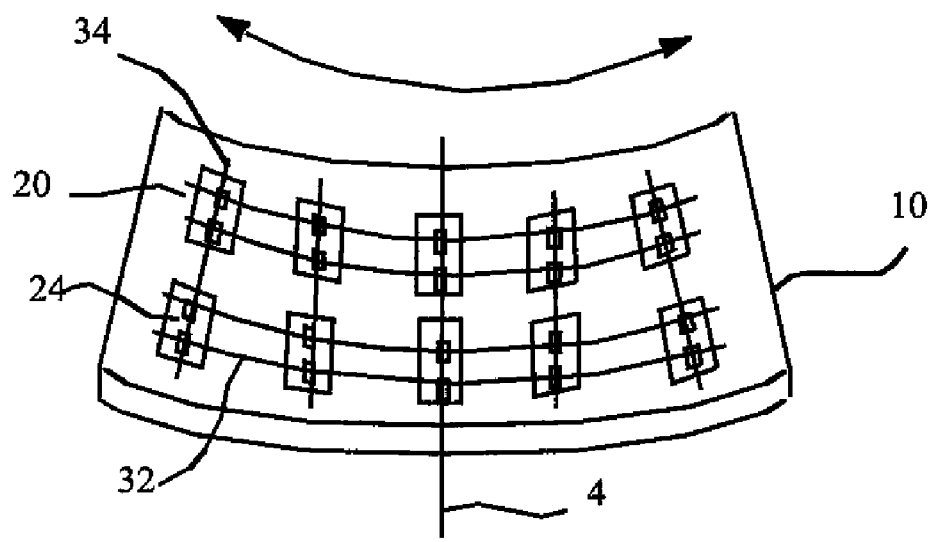
FIG. 7 is a perspective of a flexible device according to an embodiment of the present invention.

Some flexible devices have a preferred axis 4 about which the device is curved, for example a device intended to be rolled up into a tube, as with a scroll. Such a device only needs to bend in one direction, orthogonal to the preferred axis, as illustrated in FIG. 7. In such a case, a chiplet 20 having many directions of symmetry (e.g. one having a hexagonal or octagonal shape) can provide an advantage in that there is no direction that has a significantly greater extent or diameter than any other and, hence, is equally likely to bend (or fail) in any direction. Wires can also be routed to improve flexibility.

In a display device that has a preferred direction of curvature and comprising long and short buss wires (e.g. buss wire segments 32 and 34) formed over the substrate 10 connected to connection pads 24, the long buss wires can be formed in the direction of the preferred axis of curvature 4 to reduce strain in the wires.

Figure 8:
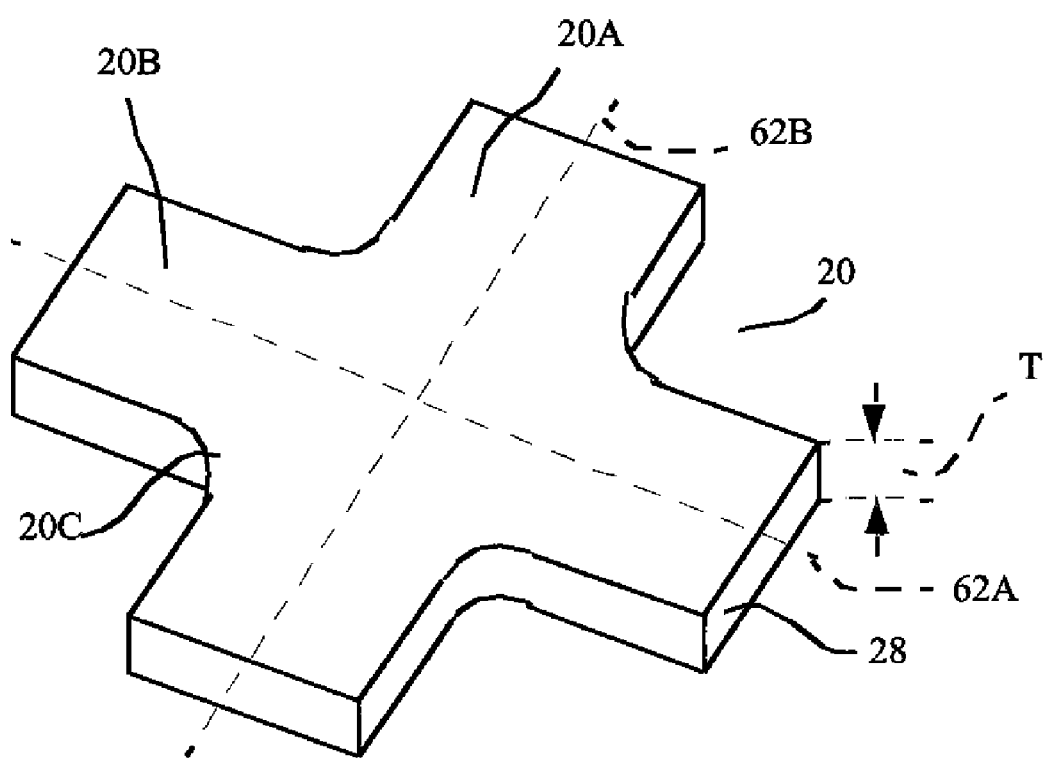
FIG. 8 is a perspective of the chiplet of FIG. 4 according to an alternative embodiment of the present invention.

For a flexible device that has two preferred axes of curvature 4, for example orthogonal axes parallel to the edges of a rectangular display, the plus sign design of FIGS. 3 and 4 can provide an advantage. Both arms 20A, 20B of the plus sign are of equal length and are shorter than the longest length of a rectangular chiplet having the same area. Hence, the plus chiplet can accommodate bending equally well in two orthogonal directions. In one embodiment, the arms of the chiplet can be aligned with the preferred axes 62A, 62B of device curvature or, alternatively, the shortest extent or diameter 60A, 60B of the plus chiplet can be aligned with the preferred axes. The chiplets can also be aligned in a common orientation to facilitate wiring and flexibility. By common orientation is meant that the corresponding edges of different devices are parallel. More generally, a flexible display device having two preferred axes about which the display device can be flexed can have chiplets oriented so that the preferred axes are parallel with a chiplet axis of symmetry. The arms 20A 20B of the chiplet are can be different lengths. Furthermore, in some layouts of busses and electrodes with plus-shaped chiplets, connection pads located in different directions along the chiplet arms can facilitate layout. The inside angles of the chiplet arms may be curved, as shown in FIG. 8, with a curved surface 20C to provide additional mechanical strength to the chiplet 20.

Chiplets are generally formed on a silicon wafer. In order to make the best use of the silicon wafer area, it is helpful if the chiplets can completely tile an area (except for the edges) as the hexagon and plus sign can.

In various embodiments of the present invention, the substrate or cover can be flexible. It also useful to reduce the thickness (T) of the chiplets (as shown in FIGS. 4 and 8), for example to less than 100 microns, less than 50 microns, less than 20 microns, or less than 12 microns thick. Such thinner chiplets are more flexible.

In one embodiment of the present invention employing chiplets, the chiplets 20 include multiple, different connection pads 24 connecting to pixel electrodes 12 or 16 or to buss wires 30. The connection pads 24 can be electrically connected to each other with buss portions 36 located within the chiplets 20 to maintain the electrical continuity of the buss wire(s) 30 within the display area 11. In this case, buss portions 32 of the chiplet buss wire(s) 30 forming a parallel signal conductor on the substrate are electrically interconnected with the chiplet buss portions 36 through the connection pads 24 in the chiplets 20. Other connection pads (not shown) in the chiplet 20 or in a thin-film circuit can drive the pixels 15 or connect to other busses (not shown).

A display controller 40 can drive the display with an image signal 50. The display controller 40 responds to the image signal 50 and transmits pixel information through the external busses 38 and buss wires 30 to the pixel-driving circuitry 22. The pixel-driving circuitry 22 then drives the pixels 15 with the pixel information, for example driving the pixels 15 to emit light at a luminance specified in the image signal 50.

Each chiplet 20 has a substrate 28 that is independent and separate from the display device substrate 10. As used herein, distributed over the substrate 10 means that the chiplets 20 are not located solely around the periphery of the display array but are located within the array of pixels, that is, beneath, above, or between pixels 15 in the light-emitting display area 11. Preferably, chiplet interconnection busses are formed in a single wiring layer at least partially above the chiplets 20.

In operation, a controller 40 receives and processes an image signal 50 according to the needs of the display device and transmits the processed signal through the buss wire(s) 30 to each chiplet 20 in the device, possibly in combination with additional control signals routed through the same or separate buss wires. The processed signal includes luminance information for each light-emitting or light-controlling pixel element 15. The chiplets then activate the pixels 15 according to the associated data value. The buss(es) can supply a variety of signals, including timing (e.g. clock) signals, data signals, select signals, power connections, or ground connections.

The controller 40 can be implemented as a chiplet and affixed to the substrate 10. The controller 40 can be located around the periphery of the substrate 10, or can be external to the substrate 10 and comprise a conventional integrated circuit.

According to various embodiments of the present invention, the chiplets 20 can be constructed in a variety of ways, for example with one or two rows of connection pads 24 along an arm of a chiplet 20 or in a single polygon around the periphery of the chiplet 20. The buss wire(s) 30 can be formed from various materials and use various methods for deposition on the device substrate. For example, the buss wire(s) 30 can be metal, either evaporated or sputtered, for example aluminum or aluminum alloys. Alternatively, the buss wire(s) 30 can be made of cured, conductive inks or metal oxides. In one cost-advantaged embodiment, the buss wire(s) 30 are formed in a single layer.

The present invention is particularly useful for multi-pixel device embodiments employing a large device substrate, e.g. glass, plastic, or foil, with a plurality of chiplets 20 arranged in a regular arrangement over the device substrate 10. Each chiplet 20 can control a plurality of pixels 15 formed over the device substrate 10 according to the circuitry in the chiplet 20 and in response to control signals. Individual pixel groups or multiple pixel groups can be located on tiled elements, which can be assembled to form the entire display.

According to the present invention, chiplets 20 provide distributed pixel control elements over a substrate 10. A chiplet 20 is a relatively small integrated circuit compared to the device substrate 10 and includes a circuit 22 including wires, connection pads, passive components such as, resistors or capacitors, or active components such as transistors or diodes, formed on an independent substrate. Chiplets are separately manufactured from the display substrate 10 and then applied to the display substrate 10. The chiplets 20 are preferably manufactured using silicon or silicon on insulator (SOI) wafers using known processes for fabricating semiconductor devices. Each chiplet 20 is then separated prior to attachment to the device substrate 10. The crystalline base of each chiplet 20 can therefore be considered a chiplet substrate 28 separate from the device substrate 10 and in which the chiplet circuitry 22 is disposed. The plurality of chiplets 20 therefore has a corresponding plurality of chiplet substrates 28 separate from the device substrate 10 and each other. In particular, the independent chiplet substrates 28 are separate from the substrate 10 on which the pixels 15 are formed and the areas of the independent, chiplet substrates 28, taken together, are smaller than the device substrate 10. Chiplets 20 can have a crystalline substrate 28 to provide higher performance, and smaller, active components than are found in, for example, thin-film amorphous or polycrystalline silicon devices. Chiplets 20 can have a thickness preferably of 100 um or less, and more preferably 20 um or less. This facilitates formation of the adhesive and planarization material over the chiplet 20 that can then be applied using conventional spin-coating techniques. According to one embodiment of the present invention, chiplets 20 formed on crystalline silicon substrates are arranged in a geometric array and adhered to a device substrate (e.g. 10) with adhesion or planarization materials. Connection pads 24 on the surface of the chiplets 20 are employed to connect each chiplet 20 to signal wires, power busses and row or column electrodes (16, 12) to drive pixels 15. Chiplets 20 can control at least four pixels 15.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets 20 of the present invention. The chiplet 20, however, also requires connection pads 24 for making electrical connection to the wiring layer provided over the chiplets 20 once assembled onto the display substrate 10. The connection pads 24 must be sized based on the feature size of the lithography tools used on the display substrate 10 (for example 5 um) and the alignment of the chiplets 20 to the wiring layer (for example +/−5 um). Therefore, the connection pads 24 can be, for example, 15 um wide with 5 um spaces between the pads. This means that the pads 24 can be significantly larger than the transistor circuitry formed in the chiplet 20.

The connection pads 24 can generally be formed in a metallization layer on the chiplet 20 over the circuitry 22. It is desirable to make the chiplet 20 with as small a surface area as possible to enable a low manufacturing cost By employing chiplets 20 with independent chiplet substrates 28 (e.g. comprising crystalline silicon) having smaller circuitry with higher performance than circuits formed directly on the device substrate 10 (e.g. amorphous or polycrystalline silicon), a device with higher performance is provided. Since crystalline silicon has not only higher performance but much smaller active elements (e.g. transistors), the circuitry size is much reduced. A useful chiplet can also be formed using micro-electro-mechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

The device substrate 10 or cover 70 can comprise flexible glass and the wiring layers made of evaporated or sputtered metal or metal alloys, e.g. aluminum or silver, formed over a planarization layer (e.g. resin) patterned with photolithographic techniques known in the art. The device substrate 10 or cover 70 can also comprise alternating layers of organic and inorganic material to form a flexible encapsulating substrate or cover. Metal foil may also be used. The present invention can be constructed in either a top-emitter format with a transparent top electrode 16 and cover 70 or a bottom-emitter format with a transparent bottom electrode 12 and substrate 10. The chiplets 20 can be formed using conventional techniques well established in the integrated circuit industry.

In embodiments of the present invention, using differential signal pairs, the substrate 10 can preferably be foil or another solid, electrically-conductive material. Busses can include a differential signal pair laid out in a differential micro-strip configuration referenced to the substrate, as known in the electronics art. In displays using non-conductive substrates, the differential signal pair can preferentially be referenced to the second electrode. LVDS (EIA-644), RS-485 or other differential signaling standards known in the electronics art can be employed on the differential signal pairs. A balanced DC encoding such as 4b5b can be employed to format data being transferred across the differential signal pair, as known in the art.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to Van Slyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or bottom-emitter architecture.

The invention has been described in detail with particular reference to certain preferred embodiments thereof, but it should be understood that variations and modifications can be effected within the spirit and scope of the invention.

PARTS LIST

T thickness
1 light ray
2 light ray
4 preferred axis of curvature
5 display device
10 substrate
11 display area
12 electrode
14 layer of light-emitting material
15 pixel
16 electrode
18 adhesion layer
20 chiplet
20A chiplet arm
20B chiplet arm
20C curved surface
22 pixel driver circuit
24 connection pad
24A connection pad
24B connection pad
28 chiplet substrate
30 buss wire
32 buss wire segment
34 buss wire segment
36 chiplet buss
38 external buss
40 controller
50 image signal
60A axis
60B axis
62A axis
62B axis
70 cover

The invention claimed is:

1. A display device, comprising:
   a) a substrate having a display area;
   b) an adhesion layer formed on the substrate surface;
   c) a plurality of chiplets adhered to the substrate and distributed within the display area, each chiplet having one or more connection pads, wherein each chiplet has more than four sides;
   d) a plurality of pixels formed over the adhesion layer in the display area, each pixel having a bottom electrode electrically connected to a connection pad of one chiplet, one or more layers of light-emitting material formed over the bottom electrode, and a top electrode formed over the one or more layers of light-emitting material; and
   e) a cover located over the top electrode and adhered to the substrate.

2. The display device of claim 1, wherein the display device is a flexible display device having two preferred axes about which the display device is flexed and the chiplets are oriented so that the preferred axes are parallel with a chiplet axis of symmetry.

3. The display device of claim 1, wherein the chiplet has a shape that is a polygon.

4. The display device of claim 3, wherein the chiplet has a shape that is a hexagon or an octagon.

5. The display device of claim 1, wherein the chiplet has a shape that has both concave and convex portions.

6. The display device of claim 1, wherein the substrate or cover is flexible.

7. The display device of claim 1, wherein the chiplets are less than 20 microns thick.

8. The display device of claim 1, wherein the chiplets are arranged in rows and columns to form a two-dimensional array.

9. The display device of claim 1, wherein the chiplets are arranged with a common orientation.

10. The display device of claim 1, wherein the connection pads are located around the periphery of the chiplet.

11. The display device of claim 1, wherein a connection pad is located in the center of the chiplet or wherein a connection pad is located on a line passing through the center of the chiplet.

12. The display device of claim 1, further comprising one or more buss wire(s) formed over the substrate, each buss wire connected to at least one connection pad.

13. The display device of claim 12, wherein the buss wire(s) are formed in a single layer over the substrate.

14. The display device of claim 12, wherein one or more buss wire(s) are connected to separate first and second connection pads on a chiplet, and the first and second connection pads are electrically connected within the chiplet.

15. The display device of claim 12, wherein at least one buss wire is connected to a connection pad of a plurality of chiplets.

16. The display device of claim 12, wherein the buss wire(s) form a two-dimensional grid over the substrate in the display area.

17. The display device of claim 1, wherein the display device has a preferred direction of curvature and further comprising at least one long and at least one short buss wire formed over the substrate connected to connection pads, the long buss wire(s) formed in the direction of the preferred axis of curvature.

18. A display device, comprising:
   a) a substrate having a display area;
   b) an adhesion layer formed on the substrate surface;
   c) a plurality of chiplets adhered to the substrate and distributed within the display area, each chiplet having one or more connection pads, wherein each chiplet has a shape in the form of a plus sign;
   d) a plurality of pixels formed over the adhesion layer in the display area, each pixel having a bottom electrode electrically connected to a connection pad of one chiplet, one or more layers of light-emitting material formed over the bottom electrode, and a top electrode formed over the one or more layers of light-emitting material; and e) a cover located over the top electrode and adhered to the substrate.

19. The display device of claim 18, wherein the display device is a flexible display device having two preferred axes about which the display device is flexed and the chiplets are oriented so that the preferred axes are parallel with a chiplet axis of symmetry, and wherein the two longest orthogonal extensions of the chiplet are oriented in parallel with the preferred axes.

20. The display device of claim 19, wherein the display device is a flexible display device having two preferred axes about which the display device is flexed and the chiplets are oriented so that the preferred axes are parallel with a chiplet axis of symmetry, and wherein the two shortest orthogonal diameters of the chiplet are oriented in parallel with the preferred axes.

21. The display device of claim 1, wherein the chiplet has a shape that is a regular polygon.

* * * * *